(12) United States Patent
Ma

(10) Patent No.: US 6,531,668 B1
(45) Date of Patent: Mar. 11, 2003

(54) HIGH-SPEED MEMS SWITCH WITH HIGH-RESONANCE-FREQUENCY BEAM

(75) Inventor: Qing Ma, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/943,451

(22) Filed: Aug. 30, 2001

(51) Int. Cl.$^7$ .............................. H01H 59/00; H01P 1/10
(52) U.S. Cl. ...................... 200/181; 310/309; 333/262
(58) Field of Search ................... 200/181, 329; 361/206, 207; 310/308, 309; 73/514.14–514.18, 514.21–514.23, 514.34, 514.35, 514.36–514.38; 427/58, 105; 307/112–150; 343/702; 333/262

(56) References Cited

U.S. PATENT DOCUMENTS

| | | | | |
|---|---|---|---|---|
| 5,367,136 A | * | 11/1994 | Buck | 200/181 X |
| 5,536,988 A | * | 7/1996 | Zhang et al. | 310/309 |
| 5,578,976 A | * | 11/1996 | Yao | 200/181 X |
| 5,638,946 A | * | 6/1997 | Zavracky | 200/181 |
| 5,914,553 A | * | 6/1999 | Adams et al. | 310/309 |
| 6,204,819 B1 | * | 3/2001 | Hayes et al. | 343/702 |
| 6,396,368 B1 | * | 5/2002 | Chow et al. | 200/181 X |
| 6,437,965 B1 | * | 8/2002 | Adkins et al. | 361/303 |
| 6,445,106 B1 | * | 9/2002 | Ma et al. | 310/309 |

* cited by examiner

Primary Examiner—J. R. Scott
(74) Attorney, Agent, or Firm—Schwegman, Lundberg, Woessner & Kluth, P.A.

(57) ABSTRACT

A microelectromechanical system (MEMS) switch having a high-resonance-frequency beam is disclosed. The MEMS switch includes first and second spaced apart electrical contacts, and an actuating electrode. The beam is adapted to establish contact between the electrodes via electrostatic deflection of the beam as induced by the actuating electrode. The beam may have a cantilever or bridge structure, and may be hollow or otherwise shaped to have a high resonant frequency. Methods of forming the high-speed MEMS switch are also disclosed.

20 Claims, 18 Drawing Sheets

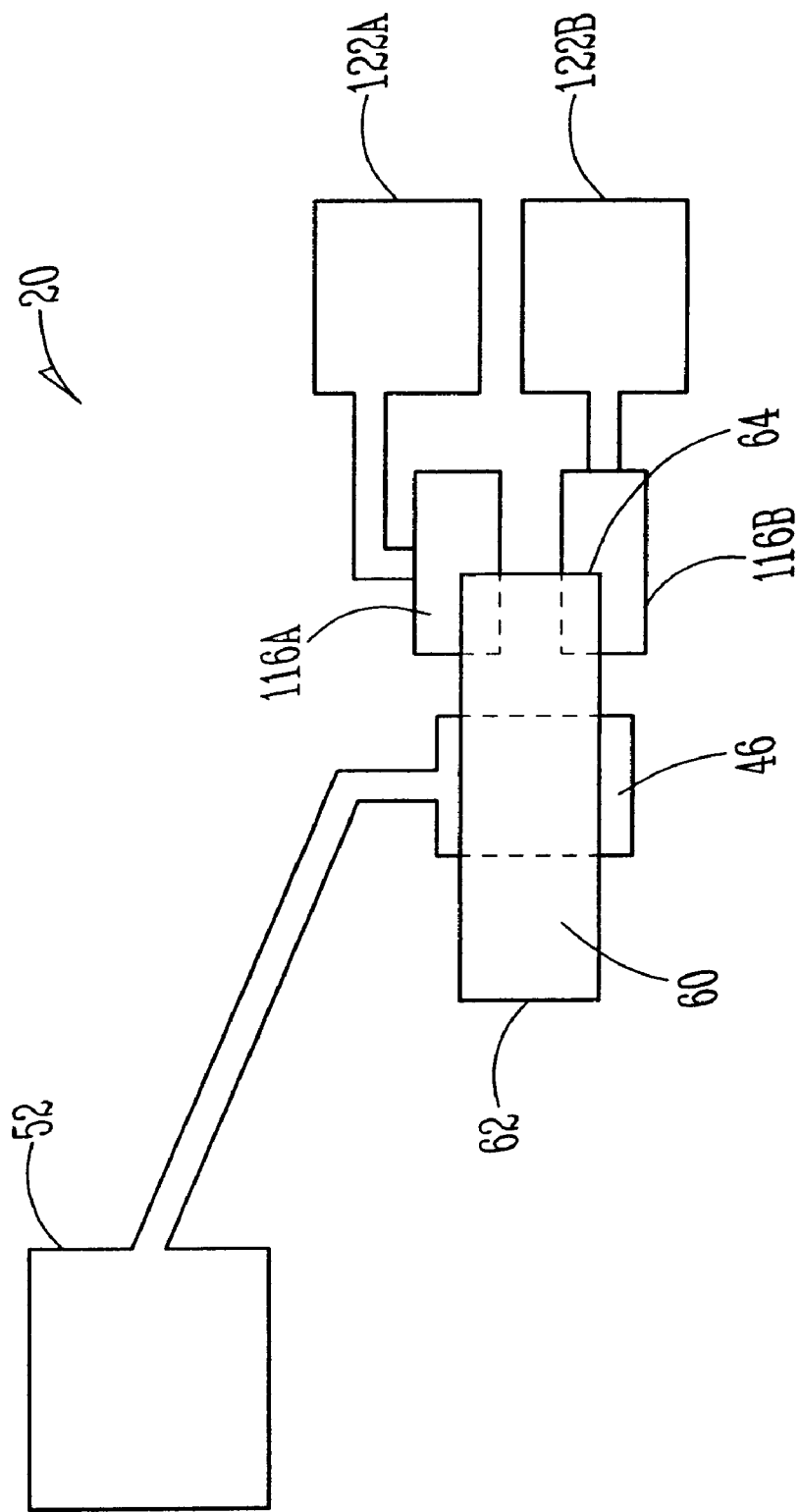

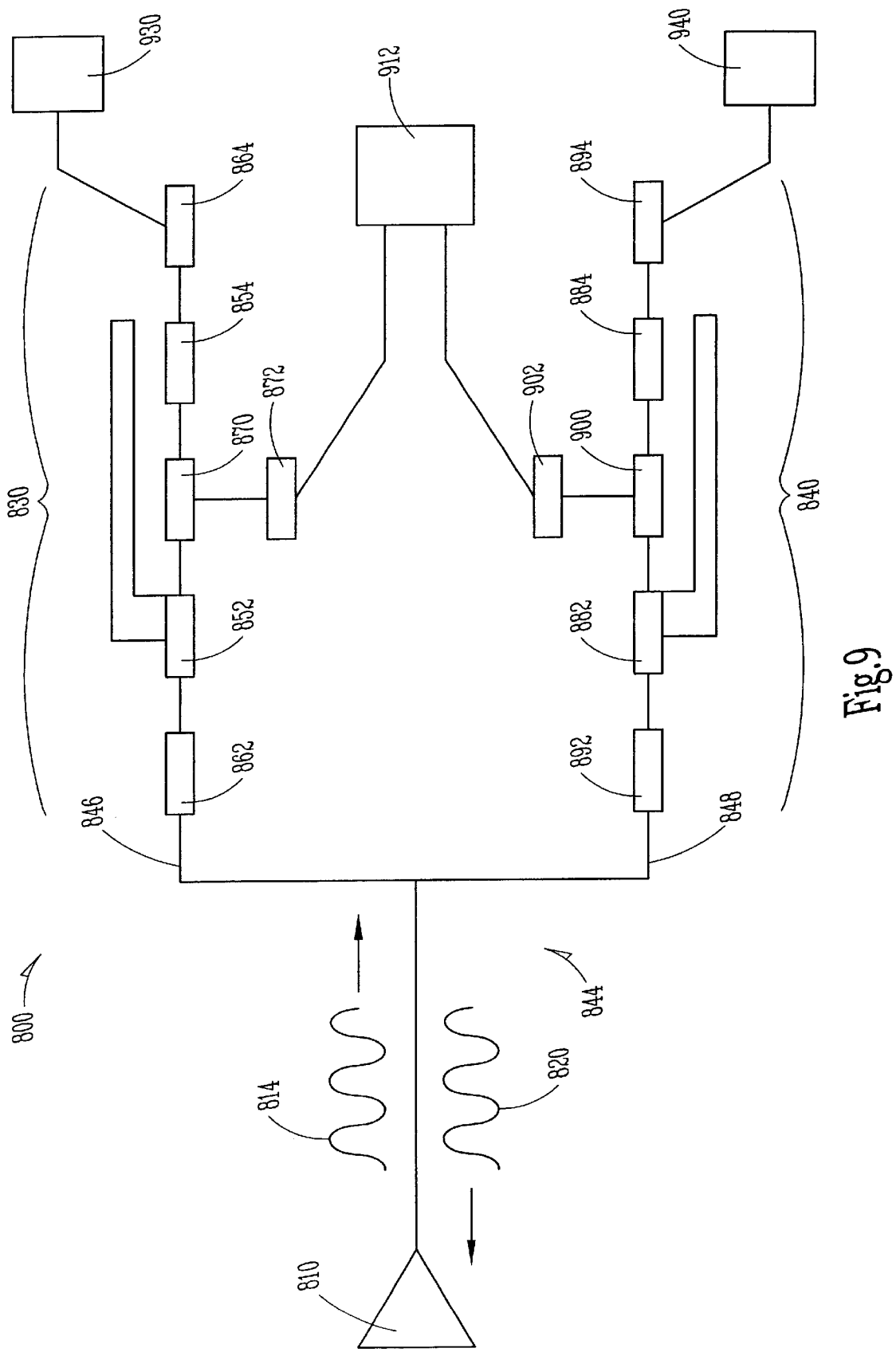

HIGH-SPEED MEMS SWITCH WITH HIGH-RESONANCE-FREQUENCY BEAM

FIELD OF THE INVENTION

The present invention relates to microelectromechanical systems (MEMS), and in particular to MEMS switches that have a connecting beam with a high resonance frequency to provide for high-speed switching.

BACKGROUND OF THE INVENTION

A microelectromechanical system (MEMS) is a microdevice that integrates mechanical and electrical elements on a common substrate using microfabrication technology. The electrical elements are typically formed using known integrated circuit fabrication techniques. The mechanical elements are typically fabricated using lithographic and other related processes to perform micromachining, wherein portions of a substrate (e.g., silicon wafer) are selectively etched away or added to with new materials and structural layers. MEMS devices include actuators, sensors, switches, accelerometers, and modulators.

MEMS switches (i.e., contacts, relays, shunts, etc.) have intrinsic advantages over their conventional solid-state counterparts (e.g., field-effect transistor (FET) switches), including superior power efficiency, low insertion loss and excellent isolation. However, MEMS switches are generally much slower than solid-state switches. This limitation precludes applying MEMS switches in certain technologies, such as wireless communications, where sub-microsecond switching is required.

MEMS switches typically include a suspended connecting member called a "beam" that is electrostatically deflected by activating an actuation electrode. The deflected beam touches one or more electrical contacts, thereby establishing an electrical connection between the contacts. When the beam is anchored to one contact while being suspended over another other in cantilever fashion, it is called a "cantilevered beam." When the beam is anchored to the substrate at opposite ends and is suspended over one or more electrical contacts, it is called a "bridge beam."

The key feature of a MEMS switch that dictates its switching speed is the form of the beam. In particular, the highest switching speed is defined by the resonance frequency of the beam, which is a function of the beam geometry. Conventional beams in MEMS switches have essentially a solid rectangular structure. While such a structure is relatively easy to fabricate, is strong, and is suitable for many switching applications, the resonance frequency of the beam is generally too low to perform high-speed switching.

BRIEF DESCRIPTION OF THE DRAWINGS

FIG. 1C is a plan view of an example embodiment of a MEMS switch similar to that illustrated in FIG. 1A but with the two electrical contacts arranged beneath the suspended end of the cantilevered beam;

FIG. 9 is a schematic circuit diagram illustrating the use of the high-speed MEMS switches of the present invention in an example wireless communication application.

In the Figures, like reference numbers refer to like elements.

DETAILED DESCRIPTION OF THE INVENTION

The present invention relates to microelectromechanical systems (MEMS), and in particular to MEMS switches that have a connecting beam with a high-resonance-frequency to provide for high-speed switching. The connecting beam can be used for MEMS contact switches, relays, shunt switches and any other type of MEMS switch.

In the following detailed description of the embodiments of the invention, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

MEMS Switch with Hollow Cantilever Beam

Figure 1A:
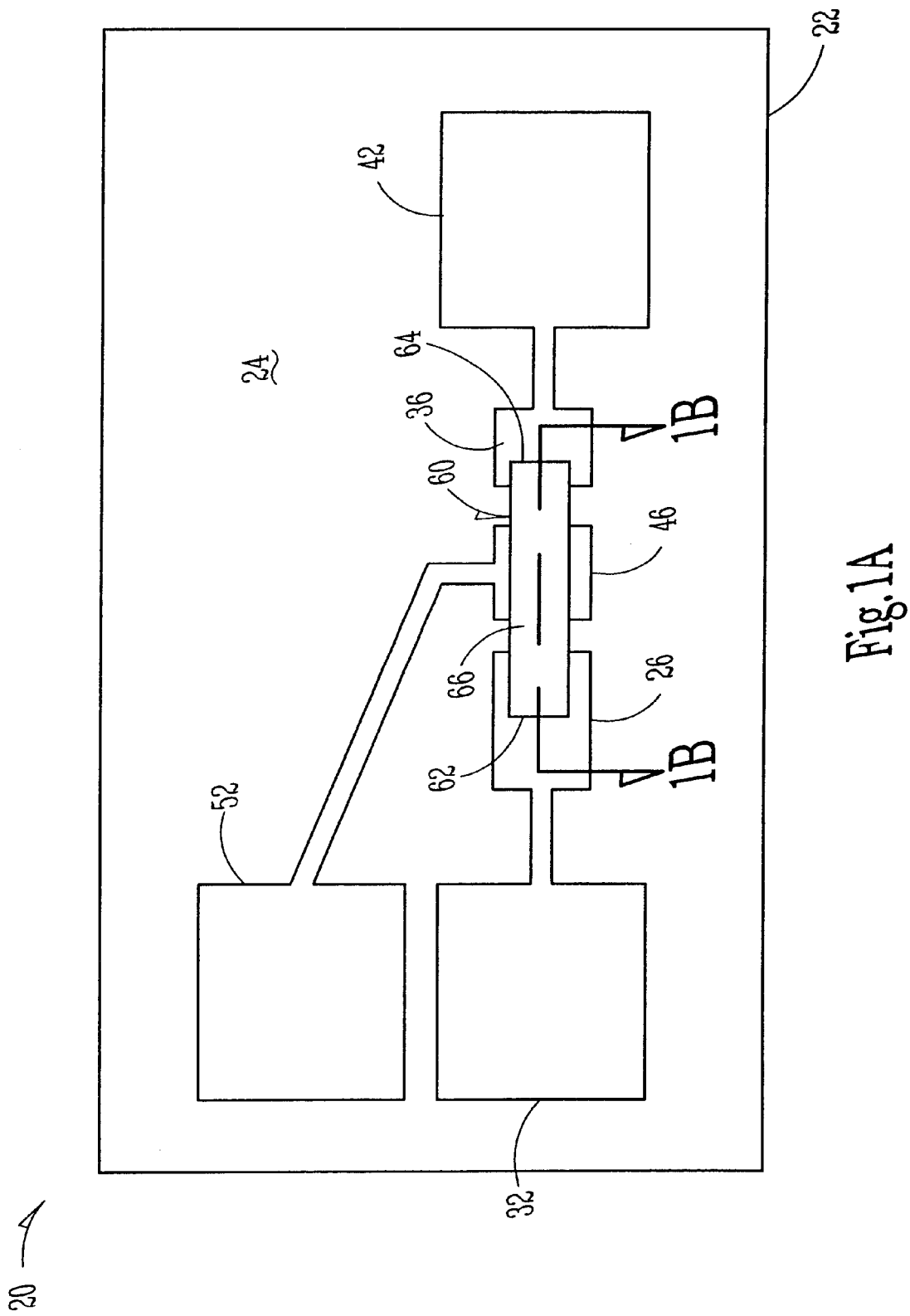
FIG. 1A is a plan view of an example embodiment of a MEMS switch of the present invention having a hollow cantilevered beam, showing the electrical contacts, actuation electrode and the associated bond pads.
Figure 1B:
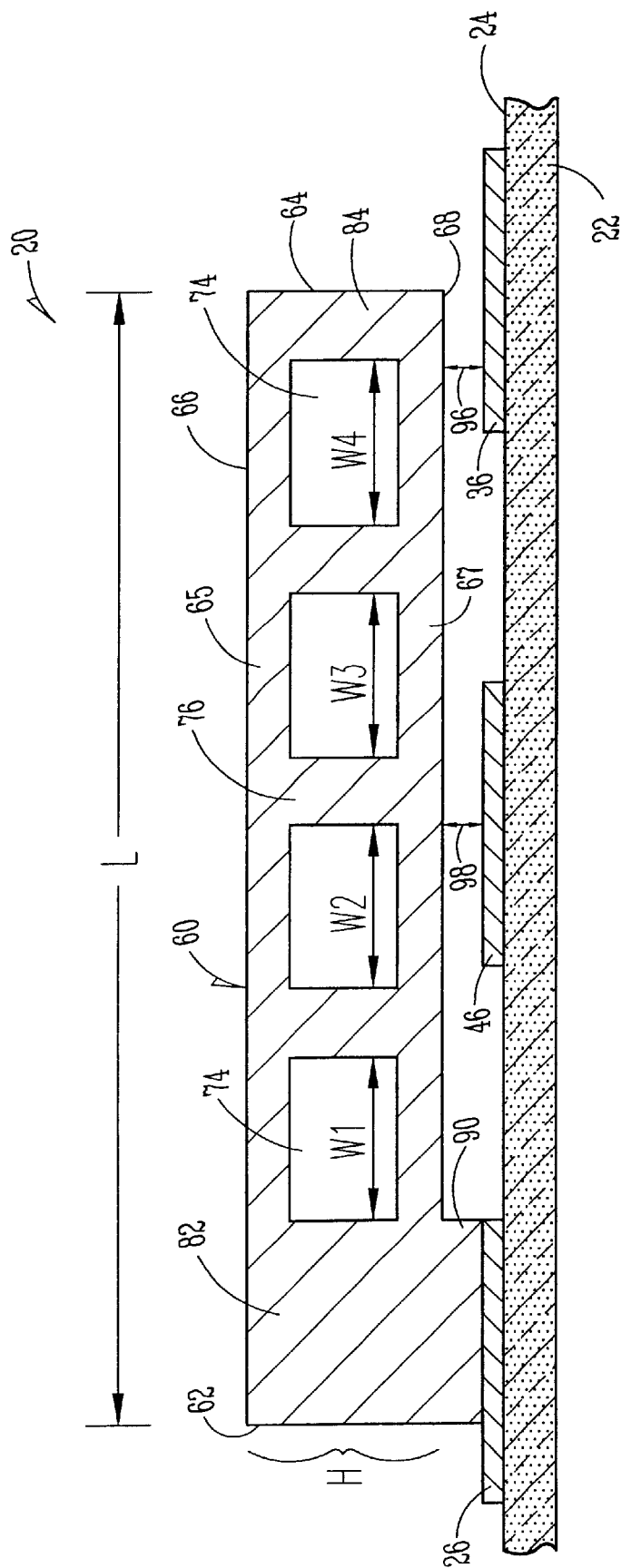
FIG. 1B is a close-up cross-sectional view of the MEMS switch of FIG. 1A taken along the line 1B—1B.

FIGS. 1A and 1B show an example embodiment of a MEMS switch 20 according to the present invention. MEMS switch 20 includes a substrate 22 with an upper surface 24 upon which is formed a first electrical contact 26 electrically connected to first bond pad 32. Also formed on upper surface 24 is a second electrical contact 36 spaced apart from the first contact and electrically connected to a second bond pad 42. An actuation electrode 46 is also formed on upper surface 24 between first and second electrical contacts 26 and 36, and is electrically connected to a third bond pad 52. Bond pads 32, 42 and 52 are for establishing electrical contact with MEMS switch 20 via probes or wires. Contacts 26 and 36, and actuation electrode 46 are preferably formed from metal, such as for example gold or aluminum.

MEMS switch 20 further includes a hollow conductive cantilever beam 60 having a first end 62, an opposite second end 64, an upper wall 65 having an upper surface 66 and a lower wall 67 having a lower surface 68. Beam 60 has a height H and a length L. In an example embodiment, beam 60 has a rectangular cross-section. Beam 60 includes one or more internal cavities 74 defined by upper and lower walls 65 and 67 and internal support members 76. In FIG. 2B, four cavities 74 are shown with respective widths W1, W2, W3 and W4. In an example embodiment, W1=W2=W3=W4. When internal support members 76 are sidewalls, multiple internal cavities 74 are formed. When internal support members 76 are posts, a single internal cavity results. Cavities 74 located adjacent ends 62 and 64 are also respectively defined by end walls 82 and 84 at respective ends 62 and 64. Methods of forming hollow beam 60 are discussed in detail further below.

In an example embodiment of the present invention, the length L of beam 60 is on the order of about 100 microns, and height H is anywhere from about 2 microns to about 5 microns. Further, cavities 74 may have a width W1 anywhere from about 5 microns to about 10 microns, depending on the height H and the length L of beam 60. Further, electrical contact 36 may have a length anywhere from about 20 microns to about 100 microns.

Beam 60 is fixed ("anchored") to first electrical contact 26 by an anchor 90 that extends downwardly from lower wall 67 at end 62. Beam 60 is arranged such that its second end 64 is suspended in cantilever fashion over at least a portion of second electrical contact 36, forming a gap 96 between lower surface 68 and the second electrical contact. In an example embodiment, gap 96 is anywhere from about 0.5 microns to about 2 microns. Likewise, lower surface 68 of beam 60 is suspended over actuation electrode 46 and is separated therefrom by a gap 98 that is sized so that the actuation electrode is in electrostatic communication with the central portion of the beam.

With continuing reference to FIGS. 1A and 1B, MEMS switch 20 operates as follows. A voltage is provided to actuation electrode 46 through bond pad 52 from a voltage source (not shown). This voltage sets up an attractive electrostatic force between actuation electrode 46 and beam 60, which deflects the beam toward the actuation electrode. This deflection causes the portion of lower surface 68 at end 64 of beam 60 to touch second electrical contact 36. This establishes an electrical connection between electrical contacts 26 and 36 via the conducting beam.

FIG. 1C shows an alternate example embodiment of MEMS switch 20 of FIG. 1A. MEMS switch 20 of FIG. 1C includes, in place of electrical contacts 26 and 36 and associated bond pads 32 and 42, two adjacent (but spaced apart) electrical contacts 116A and 116B located at least partially beneath beam end 64. Contacts 116A and 116B are electrically connected to respective bond pads 122A and 122B. Thus, switching occurs by electrostatically deflecting beam 60 to establish an electrical connection between contacts 116A and 116B via end 64 of beam 60.

The frequency at which beam 60 can be electrostatically deflected establishes the switching speed of MEMS switch 20. The switching speed is thus a function of the resonance frequency F of beam 60, which depends on the physical structure of the beam. More specifically, the beam resonance frequency F varies in proportion to the square root of the ratio of the beam stiffness S to the beam density D, i.e., $F \sim (S/D)^{1/2}$. The beam stiffness is proportional to $H^3$ (FIG. 1B)

As described above in connection with FIG. 1B, beam 60 has one or more internal cavities 74. The hollow structure of beam 60 increases the beam stiffness S while also reducing the beam density D. This results in a significant increase in the beam resonance frequency F. Thus, whereas a conventional solid beam may have a resonance frequency F on the order of 0.5 MHz, beam 60 can have a resonance frequency F on the order of several MHz. By increasing the beam height H, the resonance frequency F of beam 60 can be further increased (e.g. up to 5 MHz), leading to a concomitant increase in switching speed.

MEMS Switch with Hollow Bridge Beam

Figure 2A:
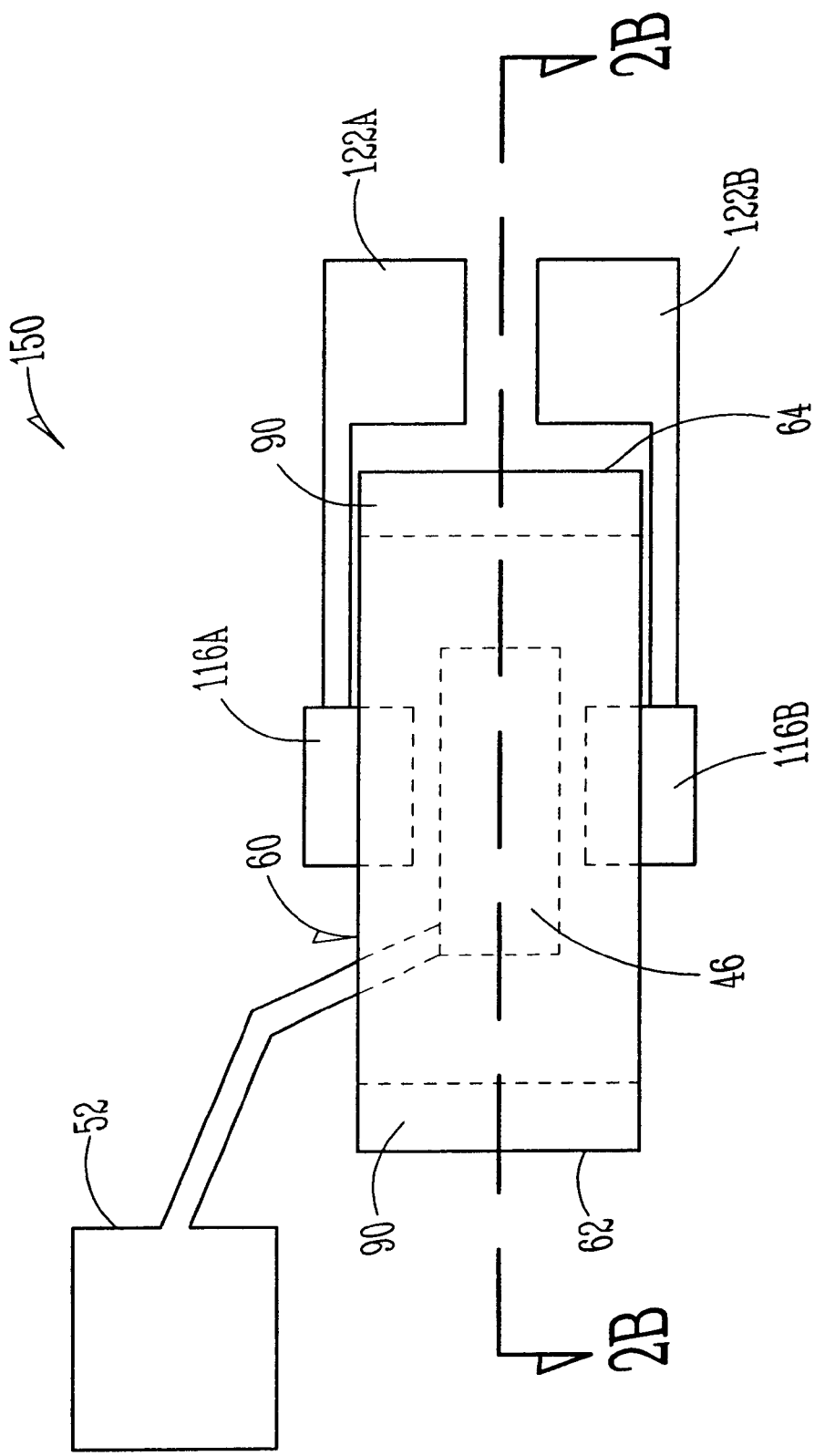
FIG. 2A is a plan view of an example embodiment of a MEMS switch of the present invention similar to FIG. 1B but having a hollow bridge beam, showing the electrical contacts, actuation electrode and associated bonding pad.
Figure 2B:
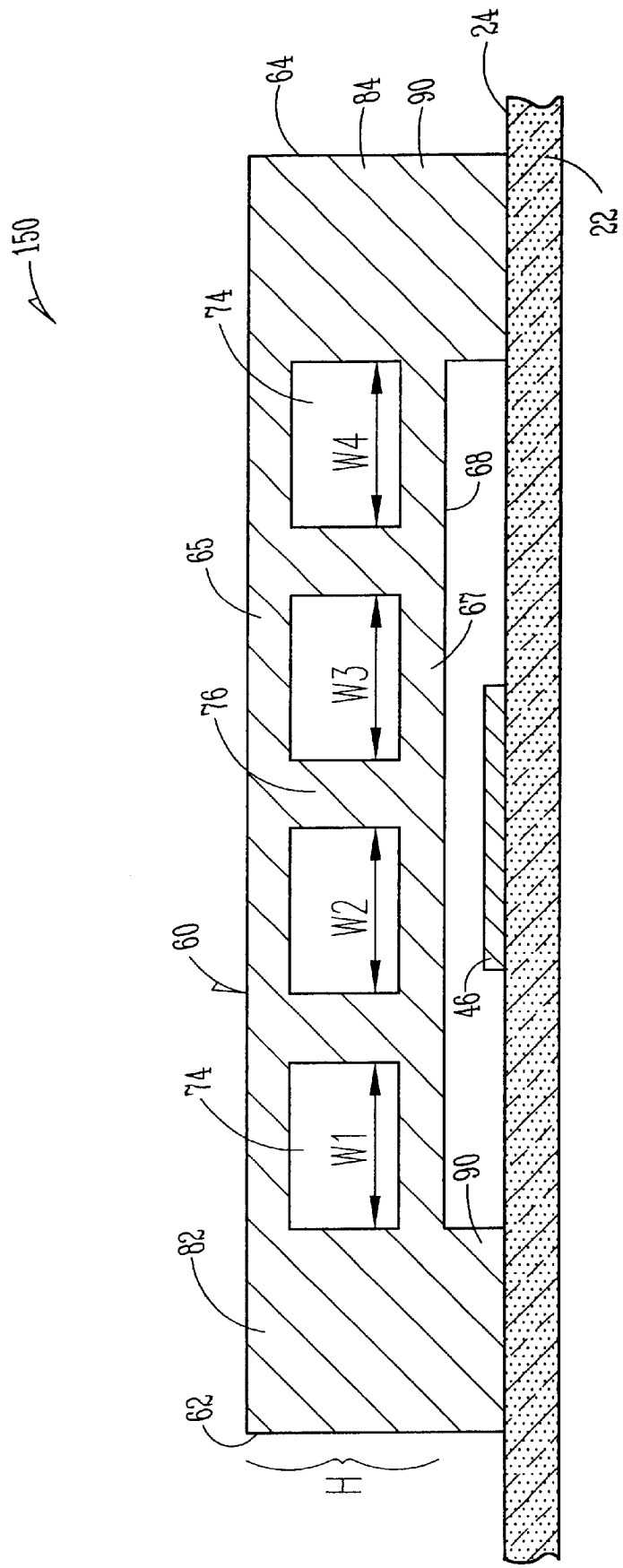
FIG. 2B is a close-up cross-sectional view of the MEMS switch of FIG. 2A taken along the line 2B—2B.

FIGS. 2A and 2B show an example embodiment of a MEMS switch 150 of the present invention similar to MEMS switch 20 described above. MEMS switch 150 includes hollow beam 60 as described above, but the beam is now fixed directly to surface 24 of substrate 22 and both ends 62 and 64 with anchors 90. Further, electrical contacts 116A and 116B are arranged on substrate upper surface 24 between anchors 90 and on either side of actuation electrode 46. In operation, beam 60 is electrostatically deflected by the activation of actuation electrode 46 so that lower surface 68 touches contacts 116A and 116B, thereby establishing an electrical connection between the contacts. For the same reasons discussed above in connection with MEMS switch 20, MEMS switch 150 is also capable of high-speed switching.

MEMS Switch with Tapered Cantilever Beam

Figure 3A:
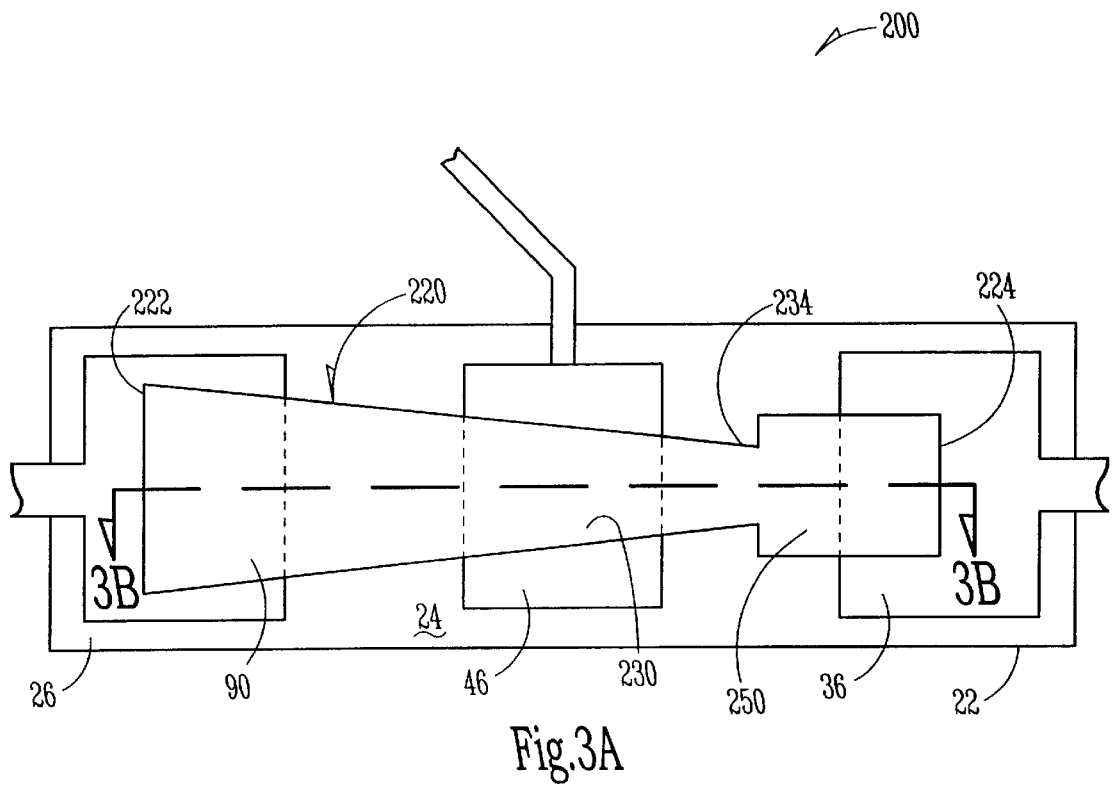
FIG. 3A is a plan view of an example embodiment of a MEMS switch of the present invention having a cantilevered beam with a tapered geometry that includes a rectangular end section.
Figure 3B:
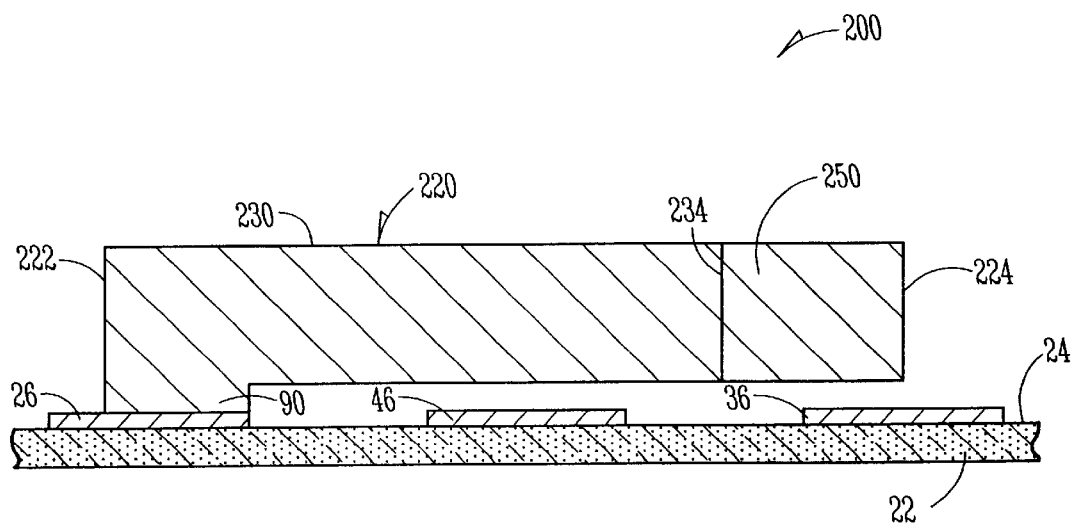
FIG. 3B is a cross-sectional view of the MEMS switch of FIG. 3A taken along the line 3B—3B.

FIGS. 3A and 3B show an example embodiment of a MEMS switch 200 according to the present invention. MEMS switch 200 is similar to MEMS switch 20 discussed above in connection with FIGS. 1A–1C. However, MEMS switch 200 includes a solid tapered cantilever beam 220. The latter has a first end 222 fixed to electrical contact 26 by anchor 90, and a free second end 224 opposite the first end. Beam 220 includes a tapered section 230 that is widest at first end 222 and that becomes increasingly narrow progressing towards second end 224. Tapered section terminates before end 224 at a narrow end 234 that adjoins a rectangular section 250, which includes end 224. Rectangular section 250 is suspended above electrical contact 36 in cantilever fashion so as to at least partially overlap the electrical contact. In an example embodiment, rectangular section 250 is wider than narrow end 234 of tapered section 230, so that a sufficient area of contact can be established between beam 60 and electrical contact 36 when the beam is deflected.

The operation of MEMS switch 200 is analogous to that of MEMS switch 20 of FIGS. 1A–1C in that electrostatic actuation from actuation electrode 46 causes the beam to deflect and establish an electrical connection between rectangular section 250 of beam 60 and contact 36.

An advantage of single-taper cantilevered beam 220 over a solid rectangular beam as conventionally used in MEMS switches is that beam 220 has a higher resonance frequency because it has a higher effective spring-constant-to-mass ratio. This means beam 220 can respond to higher-frequency electrostatic actuation, which allows for MEMS switch 200 to perform high-speed switching.

MEMS Switch with End Step Cantilever Beam

Figure 4A:
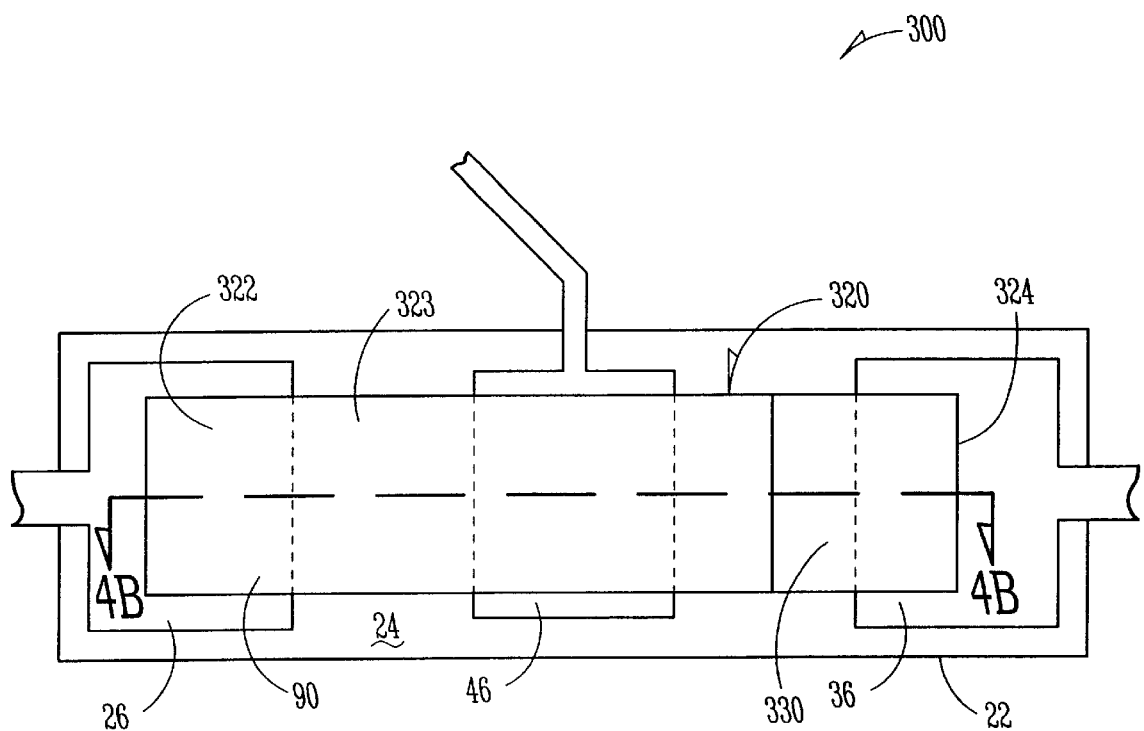
FIG. 4A is a plan view of an example embodiment of a MEMS switch of the present invention having a cantilevered beam with an end step.
Figure 4B:
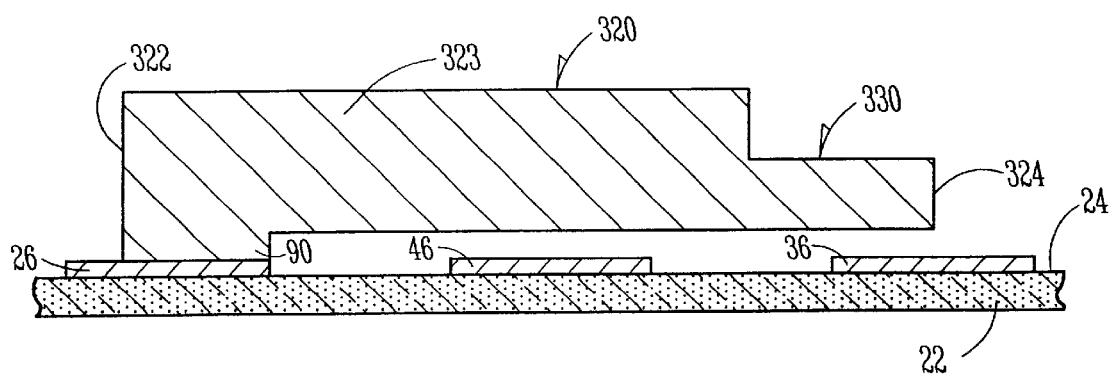
FIG. 4B is a cross-sectional view of the MEMS switch of FIG. 4A taken along the line 4B—4B.

FIGS. 4A and 4B show an example embodiment of a MEMS switch 300 according to the present invention. MEMS switch 300 is similar to MEMS switch 200 described immediately above. MEMS switch 300, however, includes a rectangular cantilever beam 320 with a first anchored end 322, a substantially uniformly rectangular central section 323, and a suspended second end 324 opposite end 322. End 324 has a step 330 formed therein, which reduces the mass of beam 320 while allowing the beam to maintain its overall stiffness. As discussed above, the reduction in mass of the beam increases the beam resonance frequency F, which allows for MEMS switch 300 to have a faster switching speed than that possible without step 330.

MEMS Switch with Double-tapered Bridge Beam

Figure 5A:
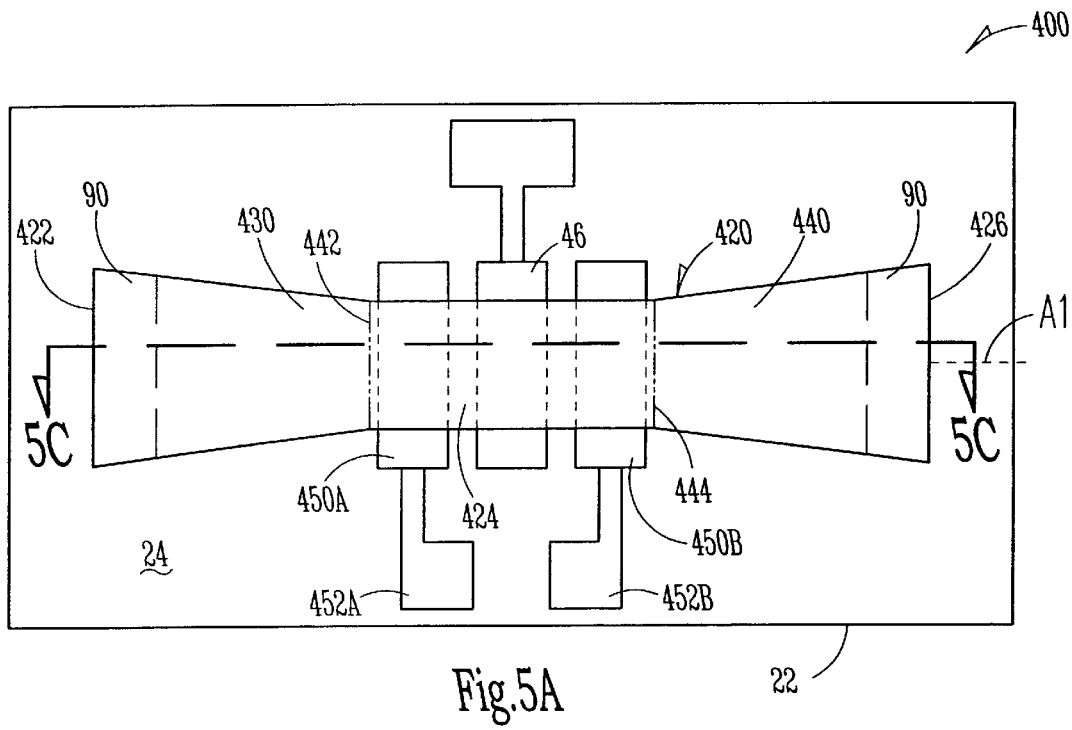
FIG. 5A is a plan view of an example embodiment of a MEMS switch of the present invention having a double-tapered bridge beam with a center rectangular section, with the electrical contacts and the actuation electrode arranged beneath the rectangular center section.
Figure 5B:
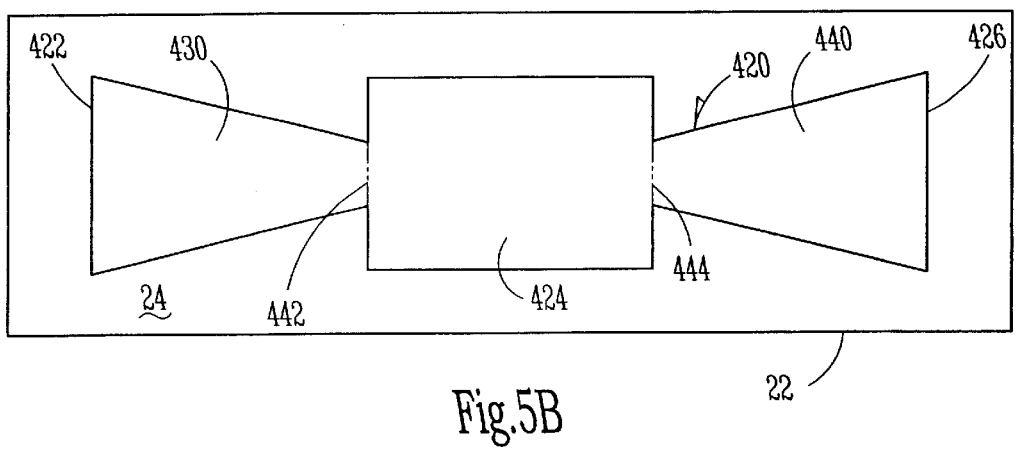
FIG. 5B is a plan view of an alternate example embodiment of the double-tapered bridge beam of FIG. 5A, wherein the center rectangular section is wider than the narrowest end of the tapered sections.
Figure 5C:
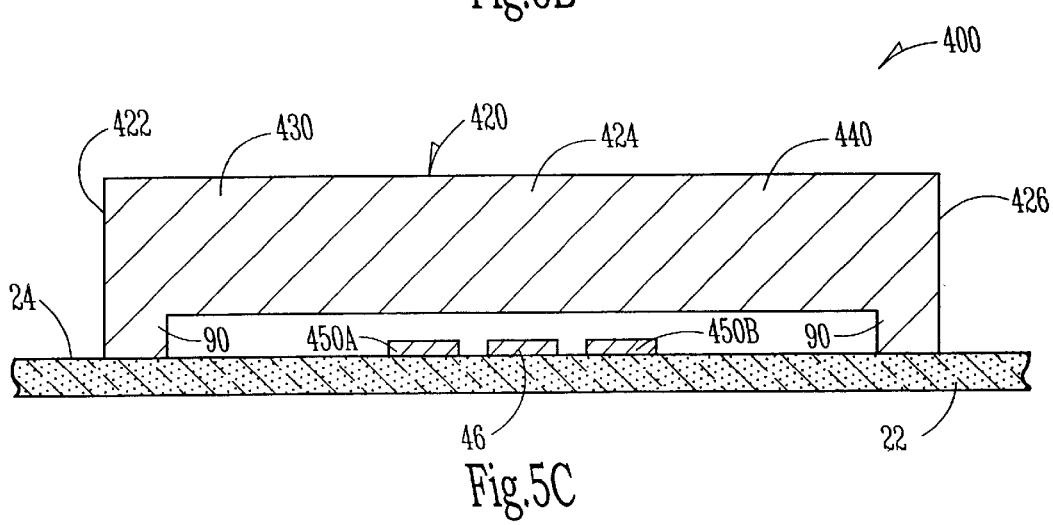
FIG. 5C is a cross-sectional view of the MEMS switch of FIG. 5A taken along the line 5C—5C.

FIGS. 5A–5C show an example embodiment of a MEMS switch 400 according to the present invention. MEMS switch 400 has a beam 420 with a first end 422 fixed to substrate surface 24 by a first anchor 90. Beam 420 also includes a rectangular center section 424, and a second end 426 opposite the first end that is fixed to the substrate surface by a second anchor 90. Beam 420 includes first and second tapered sections 430 and 440 that are wide at respective first and second ends 422 and 426 and that becoming increasingly narrow towards center section 424. First and second tapered sections 430 and 440 terminate at respective narrow ends 442 and 444 that define respective sides of rectangular center section 424. In an example embodiment, center section 424 has width that matches that of narrow ends 442 and 444, as illustrated in FIG. 5A. In another example embodiment illustrated in FIG. 5B, center section 424 has a width that is greater than that of narrow ends 442 and 444. This provides for a relatively large contact area between beam 420 and underlying electrical contacts (described below) when the beam is deflected.

MEMS switch 400 further includes first and second electrical contacts 450A and 450B formed on upper surface 24 of substrate 22 beneath center rectangular section 424. Contacts 450A and 450B are electrically connected to respective bond pads 452A and 452B. Actuation electrode 46 is arranged between contacts 450A and 450B for electrostatically engaging beam 420 and deflecting the beam downward to touch contacts 450A and 450B to establish an electrical connection between the contacts.

In an example embodiment of MEMS switch 400, the height of actuation electrode 46 is less than that of contacts 450A and 450B so that beam 420 does not touch the actuation electrode when deflected. Also, as illustrated in FIGS. 5A and 5C, in an example embodiment of MEMS switch 400 actuation electrode 46 and contacts 450A and 450B are arranged perpendicular to long axis A1 of beam 420. In another example embodiment, actuation electrode and contacts 450A and 450B can be arranged parallel to long axis A1.

As discussed above in connection with the other example embodiments of the present invention, the double taper of beam 420 results in a higher resonance frequency F than for a conventional bridge-type MEMS beam because the former has a larger effective-spring-constant-to-mass ratio.

MEMS Switch with Center-step Bridge Beam

Figure 6A:
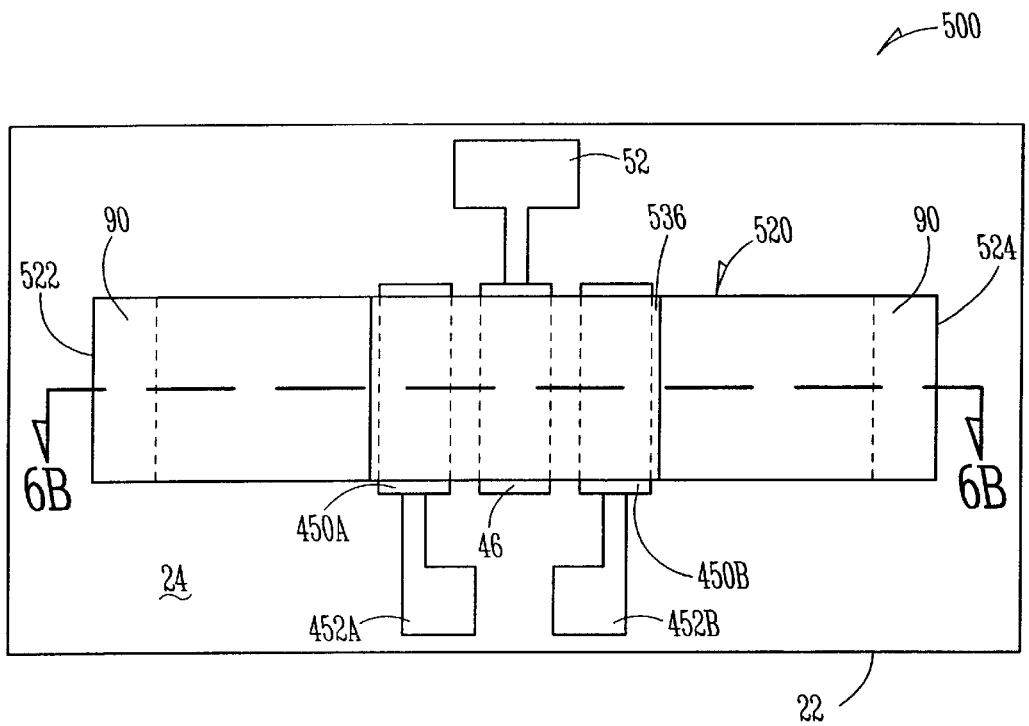
FIG. 6A is a plan view of an example embodiment of a MEMS switch of the present invention having a rectangular cantilever bridge beam with a center step section, with the electrical contacts and the actuation electrode arranged beneath the center step section.
Figure 6B:
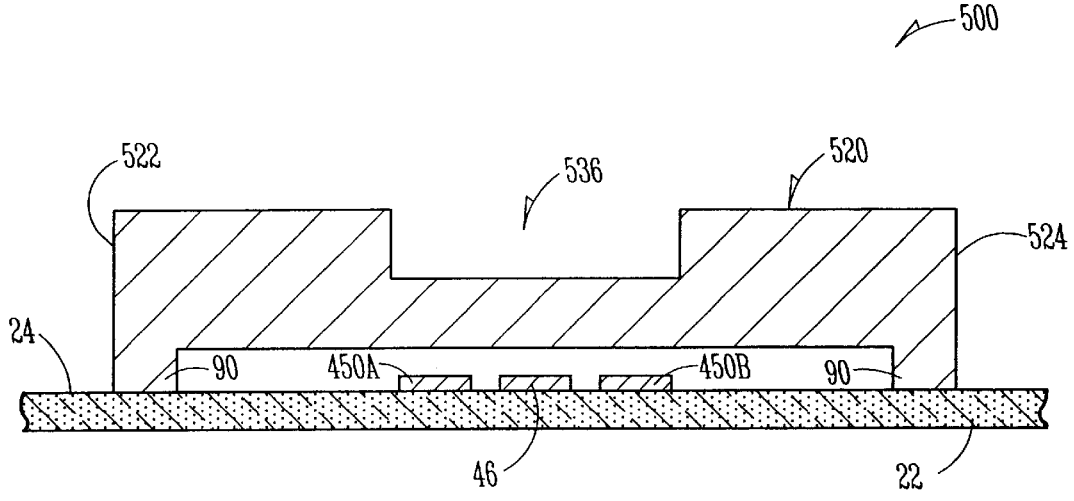
FIG. 6B is a cross-sectional view of the MEMS switch of FIG. 6A taken along the line 6B—6B.

FIGS. 6A and 6B show an example embodiment of a MEMS switch 500 similar to MEMS switch 400 discussed above in connection with FIGS. 5A–5C, the only difference being the form of the beam. MEMS switch 500 includes a rectangular beam 520 having first and second opposite ends 522 and 524 each anchored to substrate surface 24 via respective anchors 90. Beam 520 includes a center step 536 formed between ends 522 and 524 that is suspended over contacts 450A and 450B as well as over actuation electrode 46. Center step 536 reduces the mass of beam 520 as compared with a conventional rectangular beam of uniform thickness. As discussed above in connection with the other MEMS switch example embodiments of the present invention, center step 536 reduces the mass of a uniform rectangular beam, which results in an increase of the resonance frequency F of the beam, leading to faster switching speeds for MEMS switch 500.

Method of Forming MEMS Switches with Shaped Beams

FIGS. 7A through 7G describe methods of fabricating the MEMS switches of the present. Fabrication begins with the formation of a shaped cantilevered beam such as beam 220 of MEMS switch 200 discussed above in connection with FIGS. 3A and 3B.

Figure 7A:
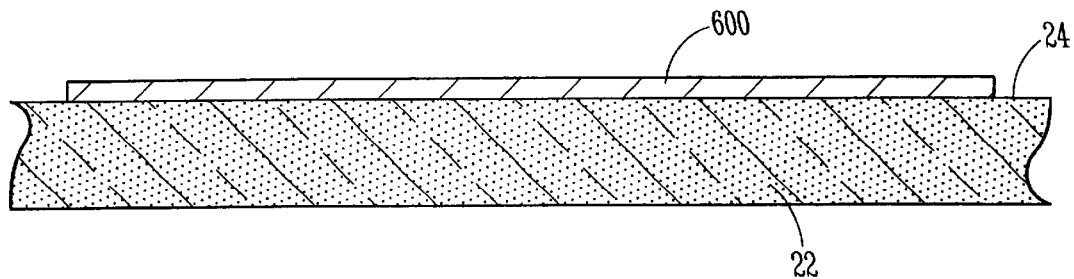
FIGS. 7A, 7B, 7C, 7D, and 7E are cross-sectional views of a substrate during the various processing steps for forming a MEMS switch with a cantilever beam designed to have a high resonance frequency.
Figure 7B:
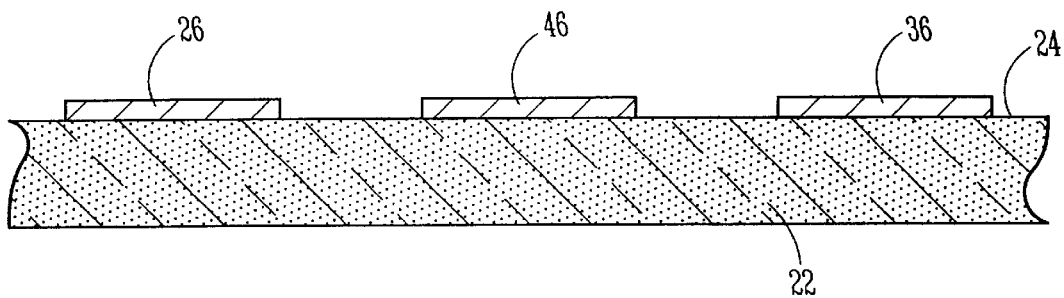

With reference first to FIGS. 7A and 7B, actuation electrode 46 and electrical contacts 26 and 36 (as example electrical contacts) are formed by first depositing a conductive layer 600 atop surface 24 of substrate 22 (FIG. 7A). Conductive layer may be, for example, polysilicon or metal such as gold or aluminum. In an example embodiment, conductive layer 600 may have a thickness ranging from a few thousand angstroms up to about a micron. Conductive layer 600 is then selectively etched to form isolated contacts 26 and 36 and actuation electrode 46 (FIG. 7B).

Figure 7C:
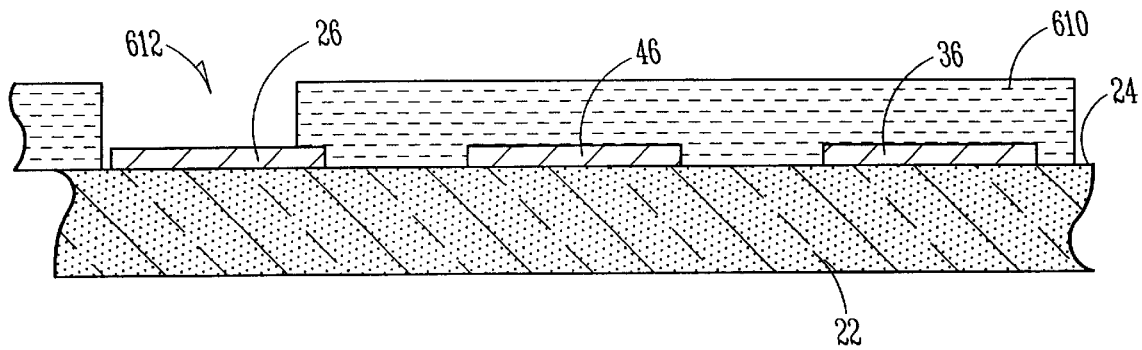

In FIG. 7C, a release layer 610 is first formed atop substrate upper surface 24, covering contacts 26 and 36 and actuation electrode 46. Release layer 610 may be, for example, an oxide such as silicon dioxide, or a polymer such as polyimide or photoresist. Release layer 610 is then selectively etched (e.g., using a dry or a reactive plasma etch) to form a first opening 612 that extends down to contact 26.

Figure 7D:
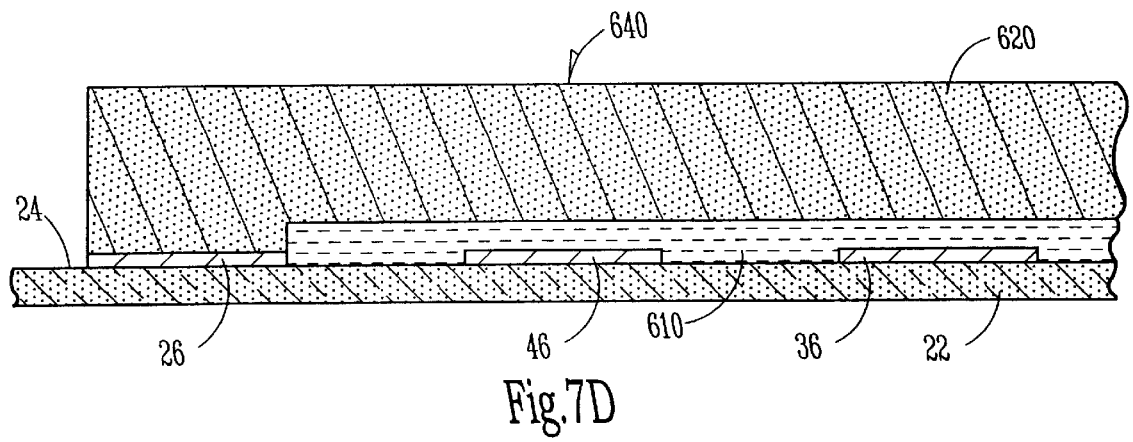

In FIG. 7D, a conductive layer 620 is then selectively formed atop release layer 610 so that it has a desired shape, such as a tapered shape (e.g., beam 220 of FIG. 3A) or stepped shape (e.g., beam 320 of FIG. 4A). The desired shape is one that will result in the formation of a high-resonance-frequency beam. Conductive layer 620 may be of the same material as conductive layer 600, e.g., polysilicon or metal. The selective deposition of conductive layer 620 may be accomplished using standard semiconductor processing techniques, such as for example by forming a masking layer (not shown) atop release layer 610 prior to depositing the conductive layer, and then stripping away the masking layer. In depositing layer 620, a portion of the conductive material fills first opening 612 down to contact 26, thereby forming anchor 90.

Figure 7E:
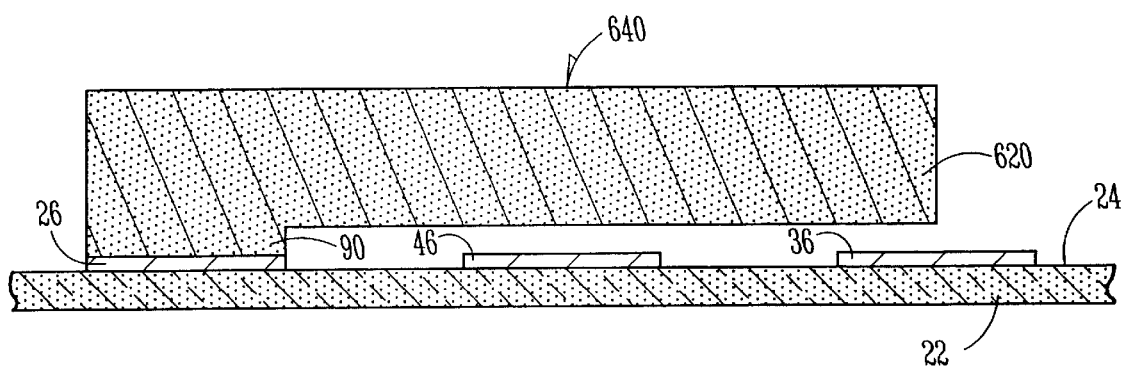
Figure 7F:
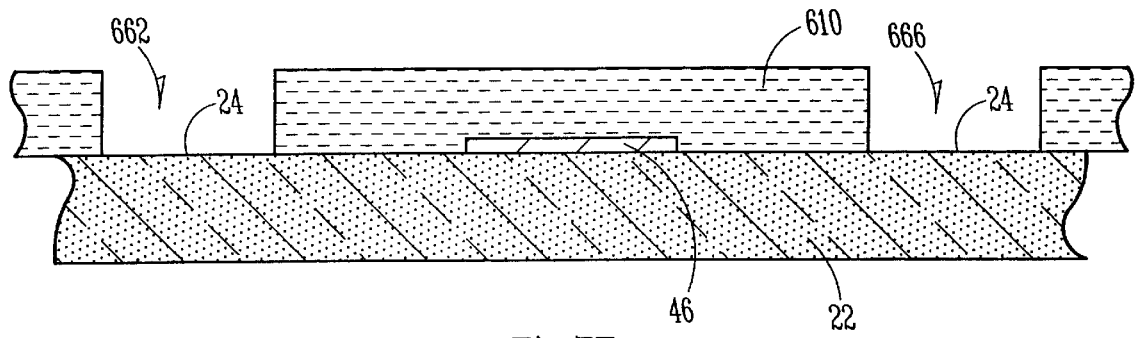
FIGS. 7F and 7G are cross-sectional diagrams similar to that of FIGS. 7C and 7D but illustrating the formation of two openings in the release layer used to form the anchors for a bridge-type beam.

In FIG. 7E, release layer 610 is removed by etching, dissolving or other techniques suitable to the material of the release layer. The result is the formation of a shaped cantilevered beam 640 formed from conductive layer 620 that is fixed to electrode 26 by anchor 90 and that has a relatively high resonance frequency F as compared with a solid rectangular beam.

Figure 7G:
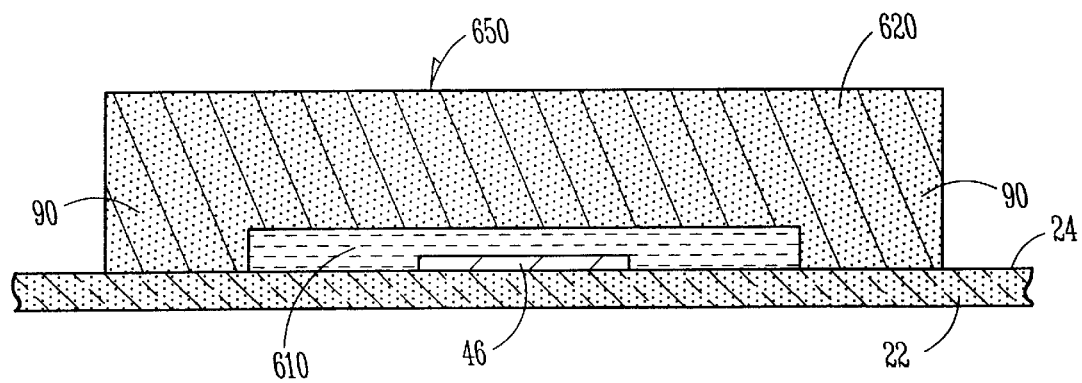

In 7F and 7G, the method described immediately above can also be used with slight modification to form a shaped bridge beam 650, such as the double-tapered bridge beam 420 of FIGS. 5A and 5B, or the center-step bridge beam 520 of FIG. 6A. In forming shaped bridge beam 650, release layer 610 is formed as discussed above in connection with FIG. 7C. Release layer 610 is then selectively etched to form first and second openings 662 and 666 on either side of actuation electrode 46 and the electrical contacts (not shown). Openings 662 and 666 extend down to surface 24 of substrate 22 and are used to form corresponding first and second anchors 90 when depositing conductive layer 620, as illustrated in FIG. 7G. Actuation electrode 46 is located between anchors 90.

Method of Forming Hollow Beam for MEMS Switch

FIGS. 8A–8H describe methods for forming hollow beam 60 of MEMS switches 20 and 150 as discussed above in connection with FIGS. 1B and 2B. The method begins with the layered structure illustrated in FIG. 7D. For the sake of clarity, only the added structures that ultimately form the hollow beam are shown in FIGS. 8B–8H.

Figure 8A:
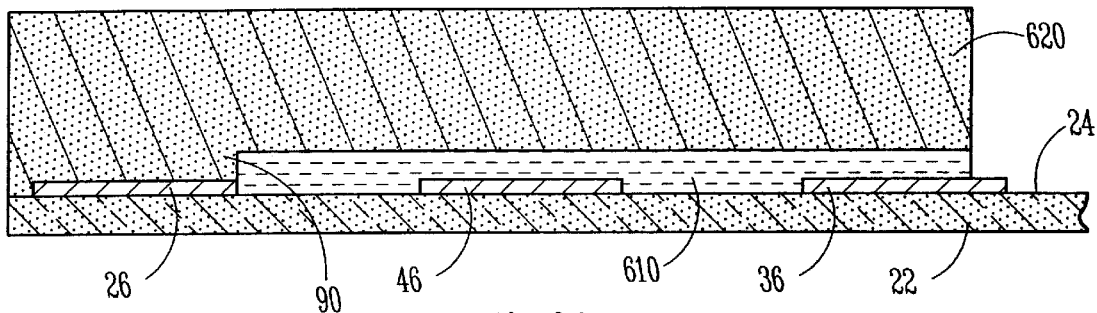
FIGS. 8A, 8B, 8C, 8E, 8F and 8I are cross-sectional views illustrating the various structures formed when fabricating the hollow rectangular beam of the MEMS switches of FIGS. 1B and 2B.
Figure 8B:
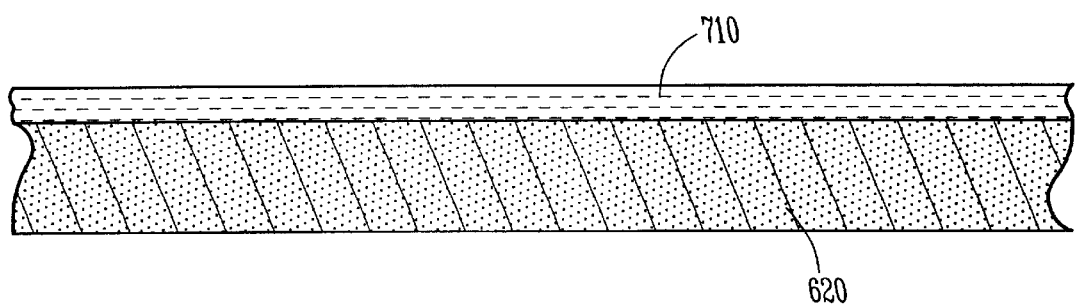
Figure 8C:
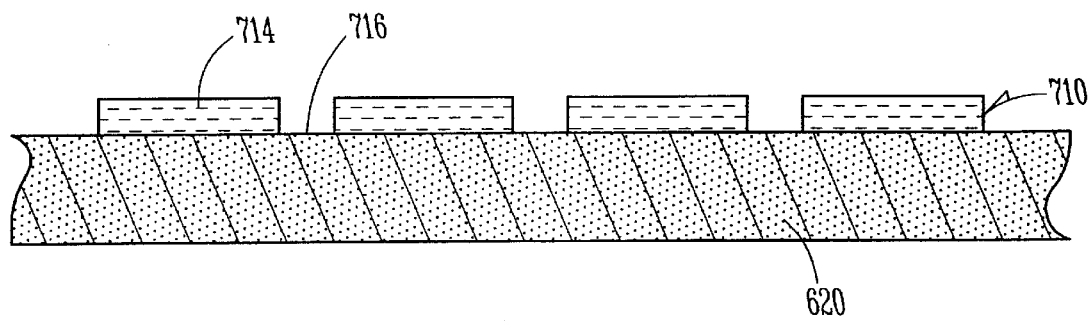
Figure 8D:
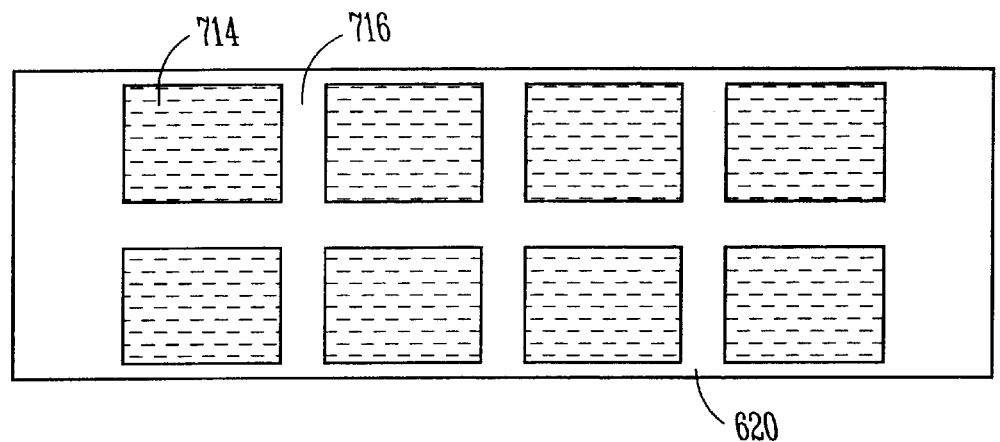
FIG. 8D is a plan view of islands of release material atop formed a first conductive layer in forming a hollow beam.

With reference now to FIG. 8A and as discussed above in connection with FIG. 7D, conductive layer 620, now a first conducting layer, is deposited atop release layer 610. In an example embodiment, layer 620 may be anywhere from 0.5 microns to 2 microns thick. With reference to FIG. 8B, atop conductive layer 620 is formed a release layer 710 similar to layer 610 discussed above. In an example embodiment, release layer 710 has a thickness anywhere from about 1 micron to about 2 microns. Release layer 710 is then selectively patterned via etching or dissolving to form, in one example embodiment, islands 714 with spaces 716 in between, as illustrated in FIGS. 8C and 8D.

Figure 8E:
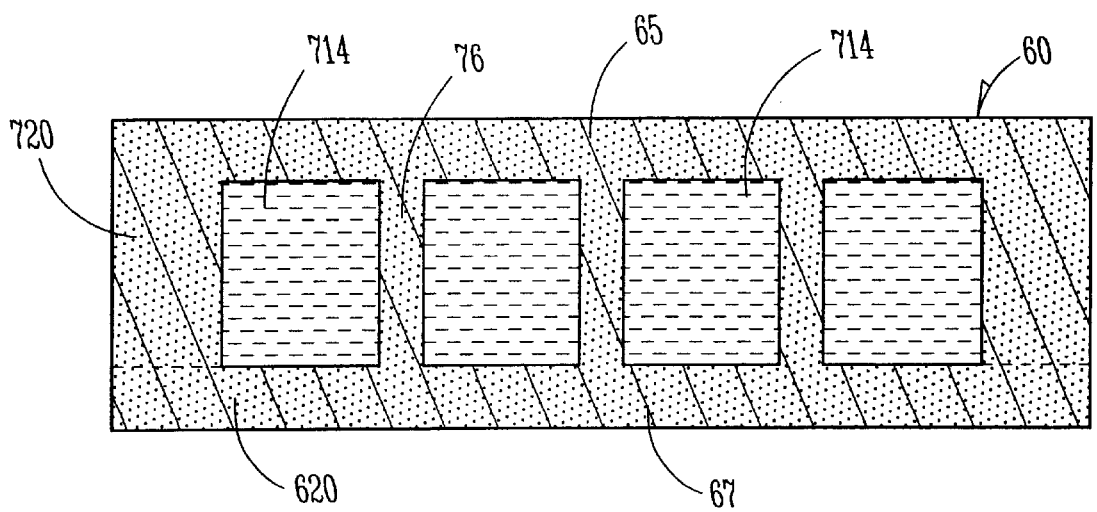

With reference now to FIG. 8E, a second conductive layer 720 is formed over islands 714 and that connects up with first conductive layer 620 (dashed line) by filling spaces 716. This process forms the framework of a hollow conductive beam 60 that includes upper wall 65 formed from second conductive layer 720, and lower wall 67 formed from conductive layer 620 (see also FIG. 1B). Conductive material that fills spaces 716 forms support members 76 in the form of sidewalls or posts that connect the lower and upper walls 65 and 67 to reinforce the beam and contribute to its stiffness. Support members 76 are preferably substantially perpendicular to upper and lower walls 65 and 67.

The actual form of support members 76 depends on the nature of spaces 716. In an alternative example embodiment to the rectangular spaces 716 illustrated in FIG. 8D, spaces 716 may instead be cylindrical openings formed within release layer 710, which are then filled with conductive material to form post-type support members 76. In this alternative embodiment, release layer 710 remains contiguous rather than divided up into islands 714.

Figure 8F:
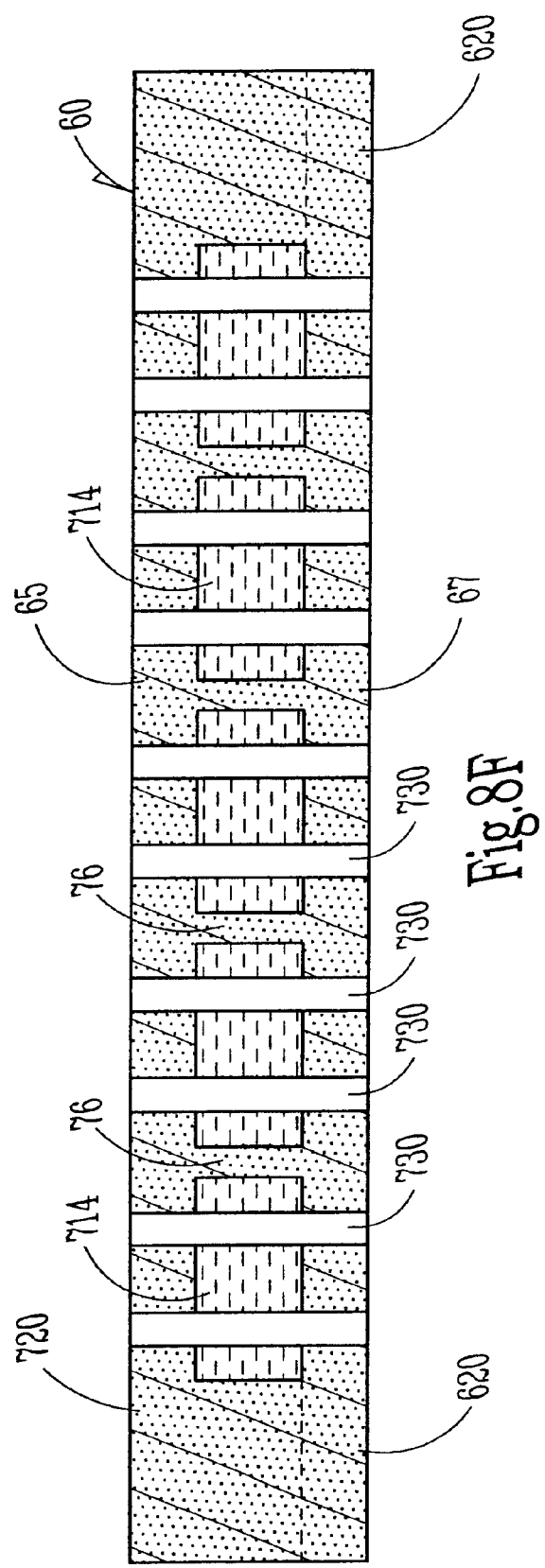
Figure 8G:
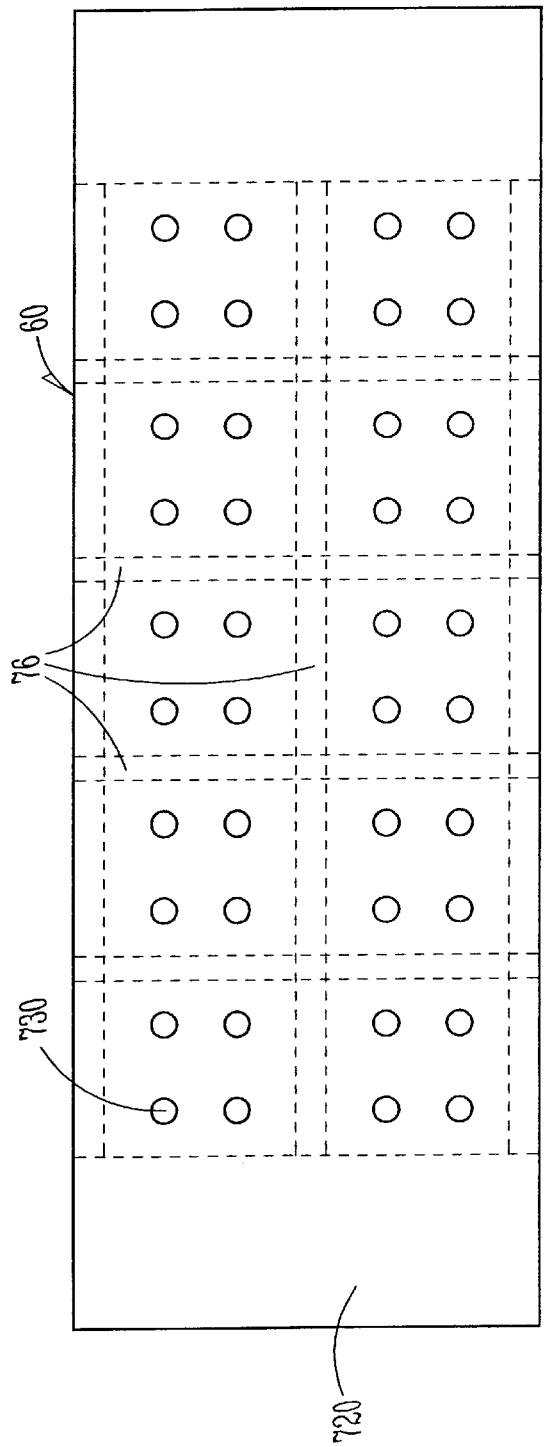
FIGS. 8G and 8H are plan views of the structure formed after covering the patterned release layer of FIG. 8D with a second conductive layer and then forming openings in the conductive layer to provide access to the release material, for the cases where the support structures are walls (FIG. 8G) and posts (FIG. 8H)
Figure 8H:
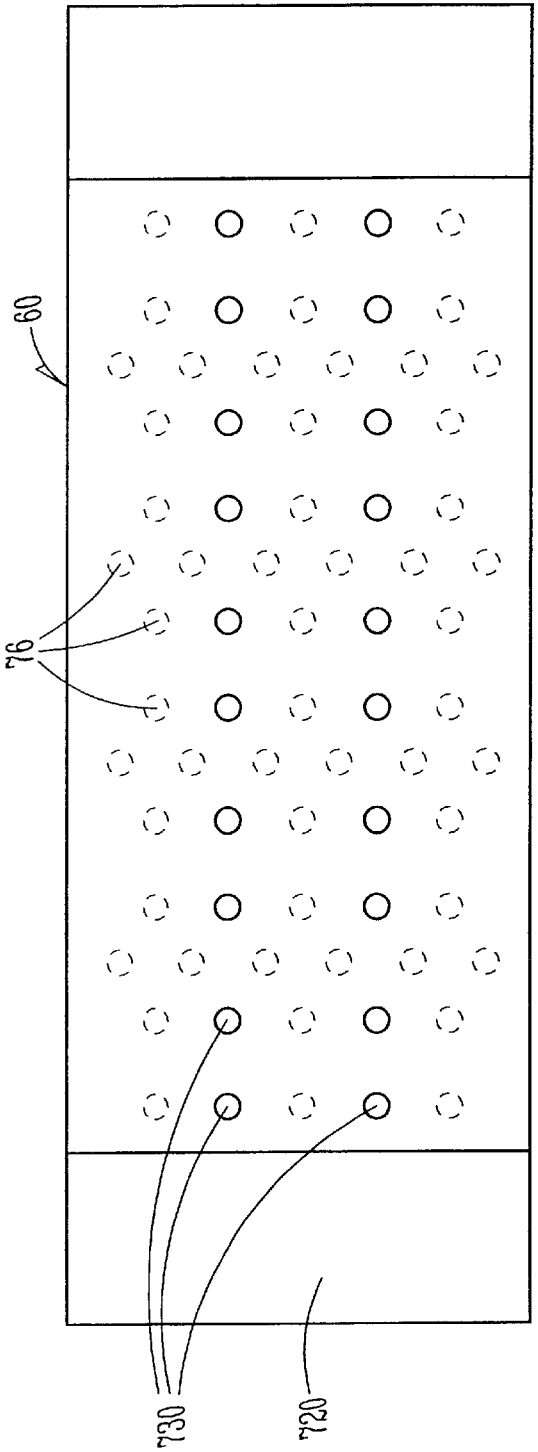

In FIGS. 8F–8H, openings 730 are then formed in second conductive layer 720 (now wall 65) of beam 60 Openings 730 extend at least through to islands 714 and may extend down through to first conductive layer 620 (now lower wall 65). Openings 730 may be formed, for example, by masking upper wall 65 with photoresist and then etching the masked structure. Openings 730 are used to provide access to islands 714 (or contiguous layer 710 in the alternative embodiment that uses post support members 76, discussed above) so that an etchant or solvent solution can be introduced to remove the release layer material.

Figure 8I:
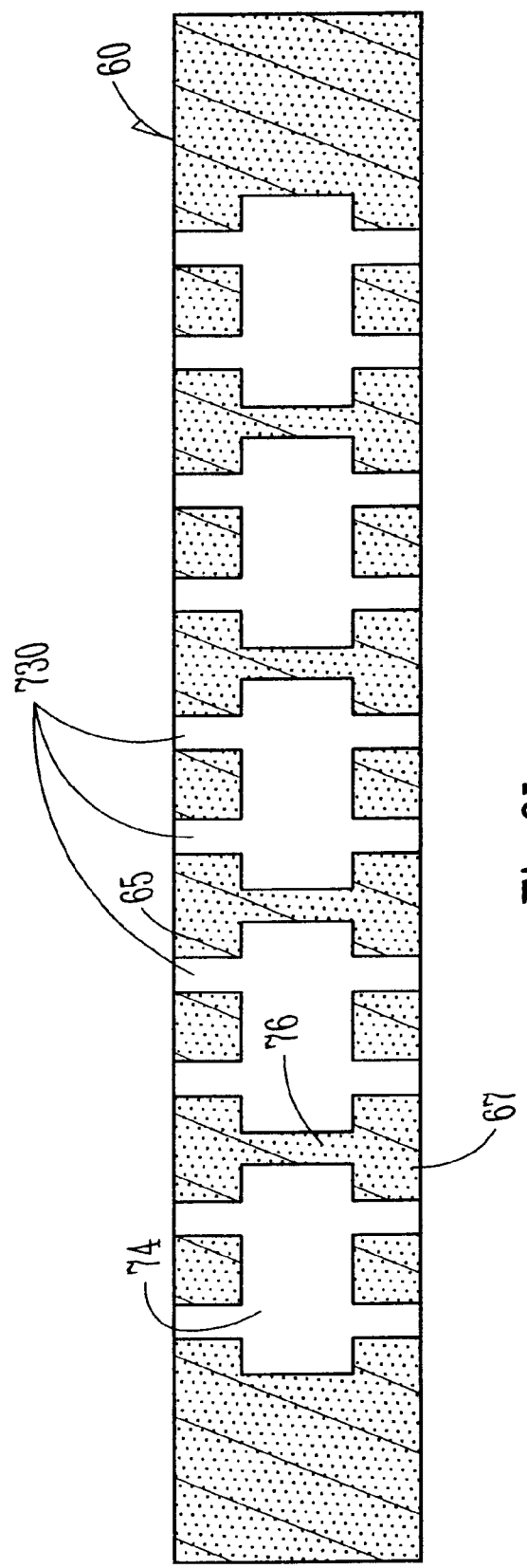

The result is the formation of one or more cavities 74, as illustrated in FIG. 8I. In the alternative embodiment wherein support members 76 are posts rather than sidewalls, a single internal cavity 74 is formed.

Openings 730 also provide a conduit for air to enter and leave the one or more cavities 74 when beam 60 is deflected, which reduces the "squeezed air" damping effect that can occurs when such cavities are sealed. This effect can reduce the resonance frequency of the beam and thus result in a slower switching speed.

Application of the MEMS Switches

FIG. 9 shows a schematic circuit diagram of a MEMS-based wireless communication system 800. System 800 includes an antenna 810 for receiving a signal 814 and transmitting a signal 820. System 800 also includes first and second MEMS switches 830 and 840 that are electrically connected to antenna 810 via a branch circuit 844 having a first branch wire 846 and a second branch wire 848. MEMS switch 830 includes first and second electrical contacts 852 and 854 electrically connected to respective bond pads 862 and 864, and an actuation electrode 870 electrically connected to a bond pad 872. Likewise, MEMS switch 840 includes first and second electrical contact 882 and 884 electrically connected to respective bond pads 892 and 894, and an actuation electrode 900 electrically connected to a bond pad 902. Thus, in an example embodiment, first branch wire 846 is connected to MEMS switch 830 via bond pad 862, while second branch wire 848 is connected to MEMS switch 840 via bond pad 892. MEMS switches 830 and 840 may be any one of the MEMS switches 20, 150, 200, 300, 400 or 500 of the present invention discussed in detail above.

System 800 further includes a voltage source controller 912 that is electrically connected to MEMS switches 830 and 840 via respective actuation electrode bond pads 872 and 902. Voltage source controller 912 includes logic for selectively supplying voltages to actuation electrodes 870 and 900 to selectively activate MEMS switches 830 and 840.

Further included in system 800 are reciever electronics 930 electrically connected to MEMS switch 830 via bond pad 864, and transmitter electronics 940 electrically connected to MEMS switch 840 via bond pad 894.

In operation, system 800 receives and transmits wireless signals 814 and 820. This is accomplished by voltage source controller 912 selectively activating MEMS switches 830 and 840 so that received signal 814 can be transmitted from antenna 810 to receiver electronics 930 for processing, while transmitted signal 820 generated by transmitter electronics 840 can be passed to antenna 810 for transmission.

An advantage of using MEMS switches rather than semiconductor-based switches (e.g., transistors) in the present application is that leakage of high transmitter power into the sensitive and fragile reciever circuits is avoided—i.e., the MEMS switches provide for high isolation. Switching between multiple frequency bands in a wireless communication device such as system 800 requires switching at frequencies of several megahertz, which is possible with the MEMS switches of the present invention.

CONCLUSION

The present invention is a MEMS switch that includes one of a number of beams having a high-resonance frequency, along with methods for forming such beams. An advantage of having a high-resonance-frequency beam is that the switching speed can be faster than that of conventional beams, which allows for the MEMS switches of the present invention to be used in a variety of applications, such as wireless communications, that require high-speed switching.

While the present invention has been described in connection with preferred embodiments, it will be understood that it is not so limited. On the contrary, it is intended to cover all alternatives, modifications and equivalents as may be included within the spirit and scope of the invention as defined in the appended claims.

What is claimed is:

1. A microelectromechanical system (MEMS) switch apparatus, comprising:
    first and second spaced apart electrical contacts formed on an upper surface of a substrate;
    an actuation electrode formed on the upper surface of the substrate adjacent the first and second electrical contacts; and
    a hollow beam to be electrostatically deflected by activation of the actuation electrode so as to establish electrical contact between the first and second electrical contacts.

2. The apparatus according to claim 1, wherein the actuation electrode is arranged between the first and second electrical contacts.

3. The apparatus according to claim 1, wherein the hollow beam is fixed at one end to the first electrical contact.

4. The apparatus according to claim 1, wherein the beam includes upper and lower walls separated by a plurality of internal support members.

5. The apparatus according to claim 4, wherein the beam includes a plurality of internal cavities defined by the internal support members and the upper and lower walls.

6. The apparatus of claim 1, wherein the beam is fixed to the substrate at first and second opposite ends of the beam by respective first and second anchors depending therefrom, and wherein the first and second electrical contacts and the actuation electrode are arranged between the first and second anchors.

7. The apparatus of claim 1, further including a voltage source controller electrically connected to the actuation electrode.

8. A microelectromechanical system (MEMS) switch apparatus comprising:
    first and second spaced apart electrical contacts formed on an upper surface of a substrate;
    an actuation electrode formed on the upper surface of the substrate adjacent the first and second electrical contacts; and
    a beam in electrostatic communication with the actuation electrode and to be electrostatically deflected to establish electrical contact between the first and second electrical contacts, the beam having a first tapered section that is wide at a first beam end and that terminates at a first narrow end.

9. The apparatus of claim 8, wherein the first beam end includes an anchor fixed to the first electrical contact, the beam further including a rectangular section that adjoins the first narrow end of the first tapered section and that is suspended over at least a portion of the second electrical contact so as to contact the second electrical contact when the beam is electrostatically deflected.

10. The apparatus of claim 9, wherein the rectangular section has a width greater than the width of the first narrow end.

11. The apparatus of claim 8, wherein the first end of the beam and a second end of the beam opposite the first end include respective anchors fixed to the substrate, the beam having a second tapered section that is wide at the second beam end and that terminates at a second narrow end, wherein the first and second narrow ends adjoin a rectangular section that at least partially overlaps the first and second electrical contacts and the actuation electrode.

12. The apparatus according to claim 11, wherein the rectangular section has a width greater than the width of the first and second narrow ends.

13. The apparatus of claim 8, further including a voltage source controller electrically connected to the actuation electrode.

14. A microelectromechanical system (MEMS) switch apparatus comprising:
    first and second spaced apart electrical contacts formed on an upper surface of a substrate;
    an actuation electrode formed on the upper surface of the substrate adjacent the first and second electrical contacts; and
    a beam to be being electrostatically deflected by the actuation electrode to establish electrical contact between the first and second electrical contacts, the beam having a step formed therein designed to increase the resonance frequency of the beam as compared to the beam without the step.

15. The apparatus of claim 14, wherein the first end of the beam includes an anchor fixed to the first electrical contact, and wherein the step section is located at a second end of the beam opposite the first end and is suspended over at least a portion of the second electrical contact.

16. The apparatus of claim 14, wherein the first end of the beam and an opposite second end of the beam include respective anchors fixed to the substrate, wherein the step is formed between the first and second ends and at least partially overlaps the first and second electrical contacts and the actuation electrode.

17. The apparatus of claim 14, further including a voltage source controller electrically connected to the actuation electrode.

18. A microelectromechanical (MEMS) switch apparatus, comprising:
    a first MEMS switch having a first actuation electrode and a first non-rectangular beam electrostatically coupled to the first actuation electrode;
    a second MEMS switch having a second actuation electrode and a second non-rectangular beam electrostatically coupled to the second actuation electrode; and
    a voltage source controller electrically coupled to the first and second actuation electrodes to selectively activate the first and second MEMS switches.

19. The apparatus of claim 18, wherein the first and second MEMS switches are electrically connected to an antenna, and wherein the first MEMS switch is electrically connected to receiver electronics to receive and process a first signal received by the antenna and the second MEMS switch is electrically connected to transmitter electronics to generate a second signal to be transmitted by the antenna.

20. The apparatus according to claim 18, wherein the first and second non-rectangular beams are selected from the group of beams comprising: a hollow beam, a single-taper beam, a double-taper beam, an end-step beam and a center-step beam.

* * * * *